US006678296B1

(12) United States Patent
Ohfuti

(10) Patent No.: US 6,678,296 B1
(45) Date of Patent: Jan. 13, 2004

(54) OPTICAL SEMICONDUCTOR DEVICE USING A SIGEC RANDOM MIXED CRYSTAL

(75) Inventor: Mari Ohfuti, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 176 days.

(21) Appl. No.: 09/664,733

(22) Filed: Sep. 19, 2000

(30) Foreign Application Priority Data

Nov. 5, 1999 (JP) .............................. 11-315424

(51) Int. Cl.⁷ .............................. H01S 5/00; H01L 33/00
(52) U.S. Cl. .............................. 372/43; 372/44; 372/39; 257/103; 257/79
(58) Field of Search .............................. 372/45, 46, 50, 372/44, 43; 257/103, 12, 13, 616

(56) References Cited

U.S. PATENT DOCUMENTS

| | | | |
|---|---|---|---|
| 4,992,837 A | * | 2/1991 | Sakai et al. ..................... 257/13 |
| 5,107,538 A | | 4/1992 | Benton et al. |
| 5,499,732 A | * | 3/1996 | Nishimoto .................... 216/24 |
| 5,798,537 A | * | 8/1998 | Nitta .......................... 257/103 |
| 5,917,981 A | * | 6/1999 | Kovacic et al. ............... 606/35 |
| 6,151,347 A | * | 11/2000 | Noel et al. ..................... 372/45 |
| 2002/0101895 A1 | * | 8/2002 | Augusto ...................... 372/44 |

FOREIGN PATENT DOCUMENTS

| | | |
|---|---|---|
| EP | 0 595 080 A | 4/1994 |
| JP | 06085317 A | 3/1994 |
| JP | 06232448 A | 8/1994 |

OTHER PUBLICATIONS

M. Ohfuti et al., "First–principle Total Energy Calculations of Atomic and Electronic Structures of $Si_{1-x-y}Ge_xC_y$," Inst. Phys. Conf. Ser. No. 162, Ch. 7, 1998, pp. 325–330.

M. Ohfuti et al., "First–principle Study of electronic Properties in Si Lattice matched SiGeC Alloy with a Low C Concentration," 1999 International on Solid State Devices and Materials (abstract only).

* cited by examiner

*Primary Examiner*—Eddie Lee
*Assistant Examiner*—Matthew C. Landau
(74) *Attorney, Agent, or Firm*—Westerman, Hattori, Daniels & Adrian, LLP

(57) ABSTRACT

An optical semiconductor device is constructed on a Si substrate and includes an active layer of a SiGeC mixed crystal in which Si, Ge and C atoms are distributed at random.

14 Claims, 7 Drawing Sheets

●Ge ○Si ⊘C

OPTICAL SEMICONDUCTOR DEVICE USING A SIGEC RANDOM MIXED CRYSTAL

CROSS-REFERENCE TO RELATED APPLICATION

The present application is based on Japanese priority application No. 11-315424 filed on Nov. 5, 1999, the entire contents of which are hereby incorporated by reference.

BACKGROUND OF THE INVENTION

The present invention generally relates to semiconductor devices and more particularly to an optical semiconductor device using a SiGeC mixed crystal for an active region thereof and an opto-electronic integrated circuit using such an optical semiconductor device.

In an optical semiconductor device, it is necessary to use a semiconductor material having a direct-transition type for the active region thereof. A direct-transition type semiconductor material causes a transition as a result of interaction with optical radiation, without intervention of phonons.

Thus, conventional optical semiconductor devices have used a III–V compound semiconductor material such as GaAs for the active region or active layer thereof. On the other hand, such a III–V semiconductor material has a drawback in that it is difficult to achieve a lattice matching with a Si substrate, which is used conventionally as the substrate of semiconductor integrated circuit. Thus, it has been difficult to construct an opto-electronic integrated circuit in which a III–V optical semiconductor device and a Si semiconductor device are integrated on a common Si substrate. Si is not a material of the direct-transition type band structure.

Meanwhile, it has been known from a theoretical calculation, in the system of SiGe mixed crystal, that the band structure of the SiGe mixed crystal changes to the direct-transition type when a Si atomic layer and a Ge atomic layer are stacked alternately in the (001) direction to form a hypothetical superlattice structure in the SiGe mixed crystal. In such a hypothetical SiGe ordered mixed crystal structure, the bottom edge of the conduction band appearing on the $\Delta$ axis coincides with the $\tau$ point as a result of the zone-folding effect of the energy band.

On the other hand, it has been known in the foregoing ordered SiGe mixed crystal system that the bottom conduction band edge on the $\Delta$ axis contains a p-orbital component with a large proportion exceeding 50% and that the number of the states of the carriers for the bottom edge of the conduction band is increased in the Si atomic layers while the number of the states for the top edge of the valence band is increased in the Ge atomic layers. In view of the situation noted above, it is difficult to realize a large probability of transition between the valence band edge and the conduction band edge in such a SiGe ordered mixed crystal.

Further, a conventional optical semiconductor device using a SiGe mixed crystal has suffered from the problem of poor carrier confinement caused as a result of small band discontinuity formed at the interface between a Si barrier layer and the SiGe active layer. Because of the poor carrier confinement, it has been difficult to achieve a laser oscillation in the optical semiconductor device using a SiGe mixed crystal for the active layer. Further, it is not possible in such a conventional semiconductor device to achieve a lattice matching between the SiGe mixed crystal and the Si substrate because of the large discrepancy of lattice constant between Si and Ge.

In view of the situation noted above, the inventor of the present invention has made a prediction that a superlattice structure of a SiGeC mixed crystal may have a band structure of direct-transition type as a result of the zone-folding effect of energy band in such a manner that the L point on the bottom edge of the conduction becomes coincident with the $\tau$ point, provided that the SiGeC mixed crystal has a superlattice structure in which Si atomic layers and $Si_{1-x}C_x$ atomic layers are repeatedly stacked in the <111> direction such that a unit of repetition contains therein the Si atomic layers and the $Si_{1-x}C_x$ atomic layers in total number of a multiple of four (Ohfuti, M., et al., Inst. Phys. Conf. Ser. No.162: Chapter 7, paper presented at $25^{th}$ Int. Sump. Compound Semiconductors, Nara, Japan, Oct. 12–16, 1998. pp.325–330). Further, the inventor confirmed the foregoing prediction by means of the energy calculation based on the first principle (Ohfuti, M., op. cit.).

On the other hand, the foregoing discovery by the inventor of the present invention is made for the superlattice structure of the SiGeC mixed crystal in which the Ge and C are "ordered." In view of the fact that the foregoing theoretical prediction of the inventor is based on the zone folding effect occurring in the ordered structure, it has not been apparent whether or not a SiGeC mixed crystal having a random arrangement of Si, Ge and C also has a direct-transition band structure similar to the one derived for the ordered SiGeC mixed crystal structure.

In the actual device fabrication, it is predicted that the formation of an ordered SiGeC mixed structure would need an atomic layer epitaxy (ALE) process in which atomic layers of Si, Ge and C are grown one layer by one layer on a properly chosen crystal surface under a properly chosen condition, while the ALE process for such an ordered SiGeC mixed crystal is complex and increases the fabrication cost of the optical semiconductor device.

SUMMARY OF THE INVENTION

Accordingly, it is a general object of the present invention to provide a novel and useful optical semiconductor device and an opto-electronic integrated circuit using such an optical semiconductor device wherein the foregoing problems are eliminated.

Another object of the present invention is to provide an efficient optical semiconductor device having an active region of a SiGeC mixed crystal in which Si atoms, Ge atoms, and C atoms are mixed at random.

Another object of the present invention is to provide an optical semiconductor device, comprising:

a Si substrate having a first conductivity type;

an active layer of a SiGeC mixed crystal formed over said Si substrate in an epitaxial relationship therewith, said SiGeC mixed crystal containing Si atoms, Ge atoms, and C atoms in a random atomic arrangement;

a cladding layer formed on said active layer with a second, opposite conductivity type;

a first electrode provided in electrical contact with said Si substrate; and a second electrode provided in electrical contact with said cladding layer.

Another object of the present invention is to provide an opto-electronic integrated circuit, comprising:

a Si substrate having a first region having a first conductivity type and a second region;

an optical semiconductor device formed on said first region of said Si substrate, said optical semiconductor device comprising: a lower cladding layer formed epitaxially on said first region of said Si substrate with said first conductivity type; an active layer of a SiGeC mixed crystal formed on said lower cladding layer epitaxially, said SiGeC mixed crystal containing Si atoms, Ge atoms, and C atoms in a random atomic arrangement; an upper cladding layer formed epitaxially on said active layer with a second, opposite conductivity type; a first electrode provided in electrical contact with said Si substrate; and a second electrode provided in electrical contact with said second epitaxial layer;

an optical waveguide formed on said second region of said Si substrate; and an electronic device formed on a third region of said Si substrate.

According to the present invention, a direct-transition type group IV semiconductor material is realized in the form of a SiGeC mixed crystal having a random arrangement for the Si, Ge and C atoms. By introducing C into the SiGeC mixed crystal, it is possible to tune the bandgap energy to the value of 0.95 eV or less corresponding to the 1.3 μm or longer wavelength band. For example, it is possible to tune the bandgap of the SiGeC mixed crystal to the 1.3 μm band by setting the atomic fraction of the Ge atoms to about 0.24 and the atomic fraction of the C atoms to about 0.03. By setting the atomic fraction of the Ge atoms to about 0.32 and the atomic fraction of the C atoms to about 0.04, the bandgap of the SiGeC mixed crystal is tuned to the 1.8 μm band. Further, by setting the atomic fraction of the Ge atoms to about 0.29 and the atomic fraction of the C atoms to about 0.036, the bandgap of the SiGeC mixed crystal is tuned to the 1.55 μm band. Thus, the SiGeC mixed crystal can be used to construct an optical semiconductor device such as a laser diode for optical telecommunication.

In view of the small bandgap of the SiGeC mixed crystal of the present invention, an effective carrier confinement is achieved when the SiGeC mixed crystal is used for the active layer of an optical semiconductor device. In the case the optical semiconductor device is used as a laser diode, a stable laser oscillation becomes possible at a room temperature environment, without providing a cooling device.

In view of the fact that the Si atoms, C atoms and Ge atoms are mixed at random in the SiGeC mixed crystal of the present invention, the optical semiconductor device can be fabricated easily by using a CVD process.

In the present invention, the SiGeC mixed crystal can be formed to achieve a lattice matching to the Si substrate by controlling the C concentration as necessary.

As the optical semiconductor device is constructed on a Si substrate, it is easy to construct an opto-electronic integrated circuit by providing a semiconductor device and an optical waveguide commonly on the Si substrate, the random SiGeC mixed crystal can also be used in such an optical waveguide as the core layer or optical waveguide layer. In such a case, it is preferable to modify the composition of the SiGeC mixed crystal forming the optical waveguide layer with respect to the composition of the SiGeC mixed crystal forming the active layer of the laser diode so as to avoid optical absorption of the laser beam produced by the laser diode.

Other objects and further features of the present invention will become apparent from the following detailed description when read in conjunction with the attached drawings.

DETAILED DESCRIPTION OF THE INVENTION

[Principle]

Figure 1A:
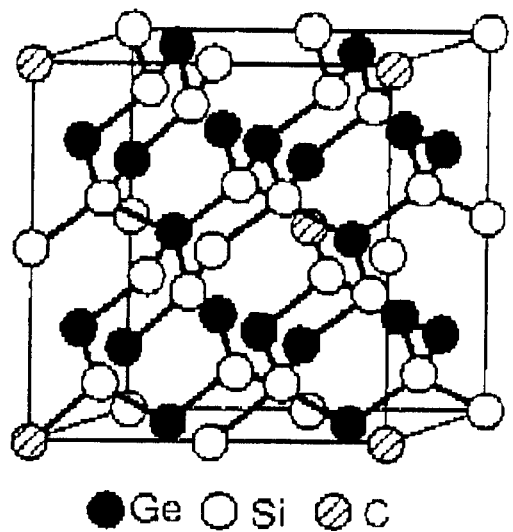
FIGS. 1A and 1B are diagrams showing the principle of the present invention.
Figure 1B:
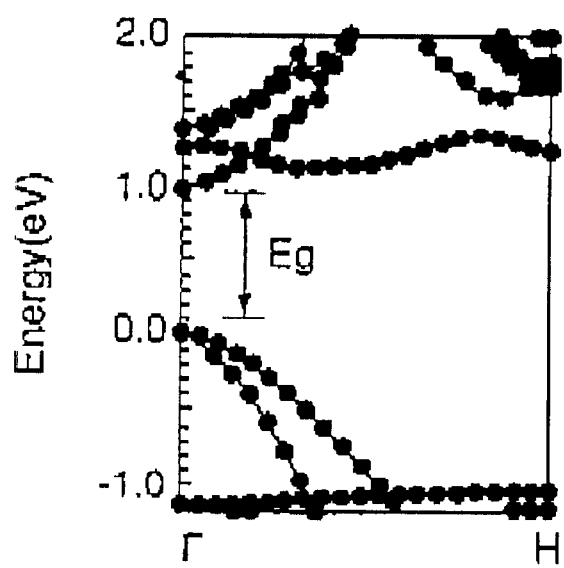

FIGS. 1A and 1B show an example of the first-principle calculation conducted in the investigation constituting the foundation of the present invention, wherein FIG. 1A shows a model structure of the unit cell used for the calculation, while FIG. 1B shows the band structure of the SiGeC mixed crystal thus derived as a result of the first-principle calculation. The calculation was made with regard to the total energy of a SiGeC mixed crystal having a random distribution of Si, Ge and C atoms so as to minimize the total energy. With regard to the details of the first-principle calculation, reference should be made to Obfuti, M., et al., op cit.

Referring to FIG. 1A, the illustrated unit cell has a composition represented as $Si_{1-x-y}Ge_xC_y$, with the compositional parameter y set to 0.031, wherein the unit cell contains C with 3.1 atomic percent. The C atoms are distributed uniformly over the SiGeC mixed crystal, and the SiGeC mixed crystal contains Ge with a concentration such that the compositional parameter x is 8–12 times as large as the compositional parameter y for C. By setting the Ge content x to be eight times as large as the C content y as such (x=8 y), it is possible to achieve a lattice matching between the SiGeC mixed crystal and a Si substrate. In the case the compositional parameter y is thus set to 3.1 atomic percent, the compositional parameter x is thus set in the range between 24.8 atomic percent (=8×3.1) to 37.2 atomic percent (–12×3.1).

Referring to FIG. 1B, the band structure is shown along the direction <100> in the model structure of FIG. 1A, wherein it can be seen that there is formed a direct-transition type band structure characterized by the feature of the bottom edge of the conduction band and the top edge of the valence band appearing at the τ point.

In the band structure of FIG. 1B, the SiGeC mixed crystal has a bandgap Eg of 0.95 eV, wherein this bandgap value is substantially smaller than the bandgap of 1.12 eV for a Si single crystal at 300K.

It should be noted that the result of FIG. 1B for the random SiGeC mixed crystal cannot be predicted from the zone-folding effect of energy band that assumes the existence of ordered structure. By increasing the C concentration, there occurs a decrease in the bandgap of the SiGeC mixed crystal and the bandgap energy causes a shift in the short wavelength direction.

Figure 2:
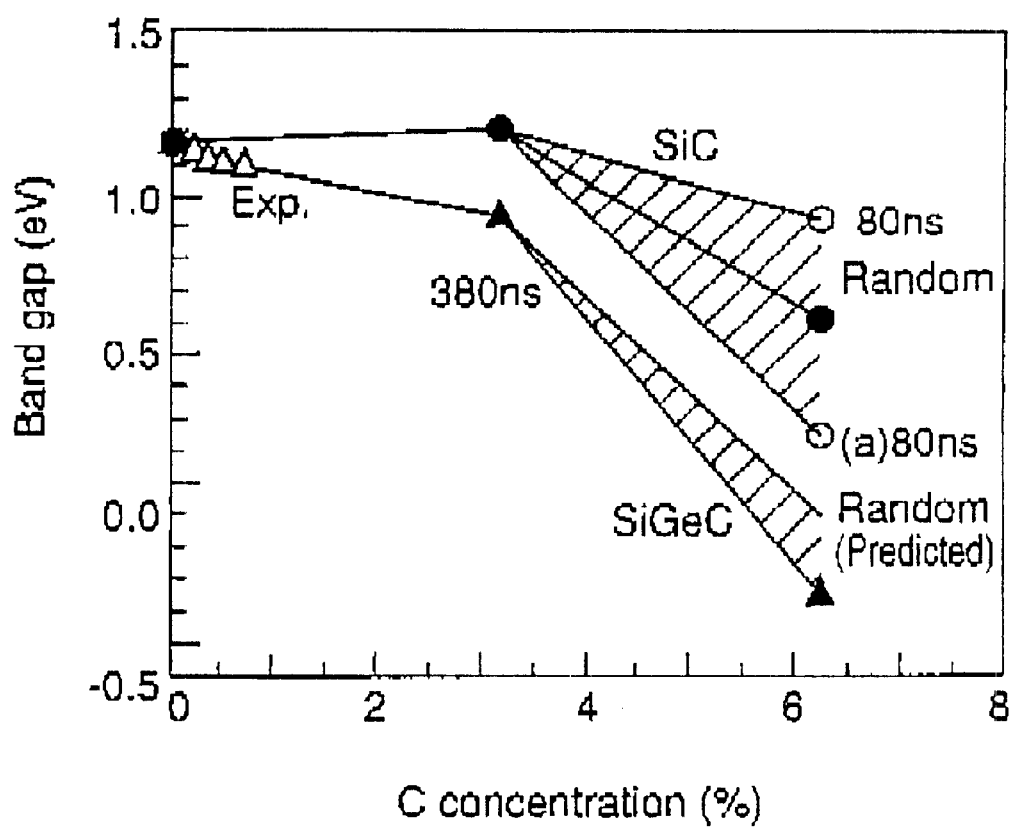
FIG. 2 is another diagram showing the principle of the present invention.

FIG. 2 shows the bandgap Eg for various C concentration levels in the SiGeC mixed crystal. In FIG. 2, it should be noted that the Ge concentration level is changed in correspondence to the C concentration level so as to maintain lattice matching to the Si substrate.

Referring to FIG. 2, it can be seen that the bandgap Eg decreases gradually with the C concentration level up to the C concentration level of 3.1 atomic percent. When the C concentration level has reached 3.1 atomic percent, it can be seen that the bandgap starts to decrease with the C concentration level with an increased rate.

According to the calculation that assumes the ordered structure for the SiGeC mixed crystal, a negative bandgap of −0.2 eV is calculated when the compositional parameter y is set to 0.063 as represented by solid triangles. According to the calculation of the present invention that deals with the random arrangement of Si, Ge and C atoms, on the other hand, no negative bandgap is calculated at this composition. At the C concentration level of 6.3%, a positive bandgap of about 0.1 eV is calculated.

In FIG. 2, the open triangles show the experimental result. Further, FIG. 2 shows the calculation for an SiC crystal, wherein the open circles represent the result for different ordered structures of Si and C atoms in the SiC crystal, while the solid circles represent the result for a random arrangement of the Si and C atoms. Further, the numerals in FIG. 2 represent the lifetime of spontaneous emission as an index of the performance of the SiGeC mixed crystal in optical applications.

From FIG. 2, it can be concluded that the mixed crystal of SiGeC having a compositional parameter y in the range between 0.031 and 0.063 can be used for an excellent narrow bandgap material in an optical semiconductor device. Further, it is concluded that such a random SiGeC mixed crystal is a promising material for an optical semiconductor device such as laser diode for use in optical fiber telecommunication system, as the bandgap of the SiGeC mixed crystal can be easily tuned to the wavelength of 1.3 $\mu$m band or 1.55 $\mu$m band by incorporating C into the SiGeC mixed crystal. By reducing the bandgap of the SiGeC mixed crystal, it becomes also possible to increase the efficiency of carrier confinement in the SiGeC mixed crystal layer used as an active layer of a laser diode by sandwiching the active layer by a pair of Si layers. Thereby, it becomes possible to operate the laser diode at a room temperature environment without using a cooling device.

As the random SiGeC mixed crystal of the present invention is easily formed as compared with the conventional SiGeC superlattice structures, the optical semiconductor device using such a random SiGeC mixed crystal can be fabricated with a reduced cost.

[First Embodiment]

Figure 3:
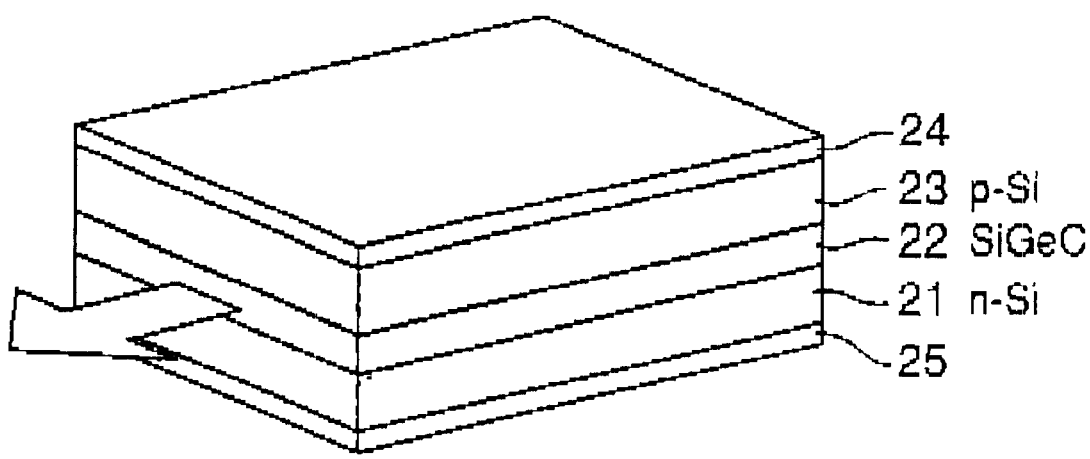
FIG. 3 is a diagram showing the construction of a laser diode according to a first embodiment of the present invention.

FIG. 3 shows the construction of a laser diode according to a first embodiment of the present invention.

Referring to FIG. 3, the laser diode is constructed on a Si substrate 21 of an $n^+$-type and includes an active layer 22 of an undoped SiGeC mixed crystal having a composition represented as $Si_{1-x-y}Ge_xC_y$ with the compositional parameter x for Ge set to 0.32 and the compositional parameter y for C set to 0.04. The active layer 22 is formed epitaxially to the underlying Si substrate 21 with a thickness of typically 300 nm, wherein the Si atoms, Ge atoms and C atoms are mixed at random in the SiGeC mixed crystal, by replacing the site of Si.

On the active layer 22, a cladding layer 23 of $p^+$-type Si is formed epitaxially, and the semiconductor layered body thus formed is cleaved at a pair of (100) surfaces to form an optical cavity. Further, an upper ohmic electrode 24 of Ti is formed on the Si cladding layer 23 and a lower ohmic electrode 25 of Ti is formed on the bottom surface of the Si substrate 21.

In the laser diode of FIG. 3, the SiGeC mixed crystal constituting the active layer 22 has the direct-transition band structure represented in FIG. 1B, and thus, there occurs a laser oscillation as a result of stimulated emission taking place in the laser optical cavity of FIG. 3 at the wavelength of 1.3 $\mu$m or a longer waterlength.

In such a laser diode, it should be noted that the active layer 22 has a bandgap substantially smaller than the bandgap of the Si substrate 21 or the bandgap of the cladding layer 23 and an efficient confinement of carriers takes place in the active layer 22. Particularly, the SiGeC mixed crystal constituting the active layer 22 achieves a lattice matching to the Si substrate 21 when the compositional parameters x and y are set to 0.32 and 0.04, respectively.

From FIG. 2, the SiGeC mixed crystal of the foregoing composition of x=0.032 and y=0.04 has a bandgap energy of about 0.7 eV corresponding to the laser oscillation wavelength of the 1.8 $\mu$m band. When the SiGeC mixed crystal of the active layer 22 has a composition of x=0.24 and y=0.03, another lattice matching composition, the laser diode oscillates at the wavelength of the 1.3 $\mu$m band in view of the bandgap of about 0.95 eV. When the SiGeC mixed crystal of the active layer 22 has a composition of x=0.29 and y=0.036, also being a lattice matching composition, the laser diode oscillates at the wavelength of the 1.55 $\mu$m band in view of the bandgap of about 0.8 eV.

In the present embodiment, no ordered structure or superlattice structure is needed in the active layer 22 for the SiGeC mixed crystal, and the Si atoms, Ge atoms and C atoms are distributed at random in the active layer 22.

The active layer 22 is typically formed by an ordinary CVD process conducted at a substrate temperature of 400–700° C. under the pressure of 0.1–100 Torr, while flowing $SiH_4$, $GeH_4$ and $SiH_3CH_3$ with respective flow rates of 60 SCCM, 250 SCCM and 100 SCCM.

In the present embodiment, it is also possible to form the cladding layer 23 by the SiGeC mixed crystal similar to the one used for the active layer 22, except that the cladding layer 23 contains smaller amount of Ge and/or C atoms. Even in such a case, an effective carrier confinement is achieved in the active layer 22 due to the increased bandgap of the cladding layer 23. In this case, too, it is preferable to choose the composition of the SiGeC mixed crystal constituting the cladding layer 23 such that the cladding layer 23 achieves a lattice matching with respect to the Si substrate 21.

[Second Embodiment]

Figure 4:
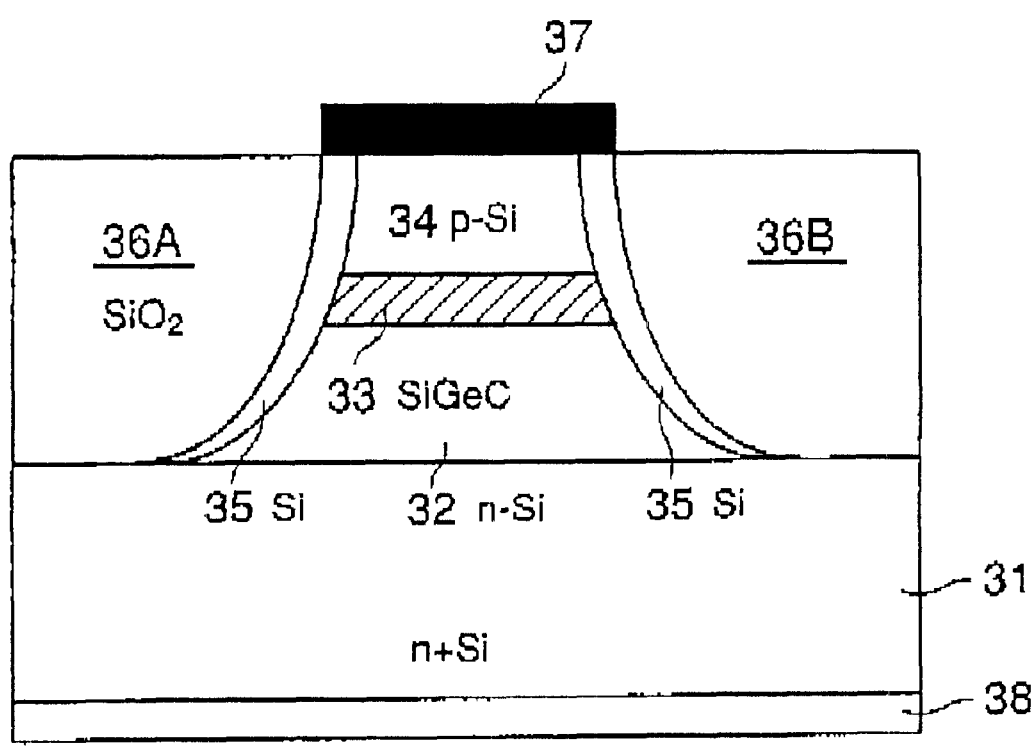
FIG. 4 is a diagram showing the construction of a laser diode according to a second embodiment of the present invention.

FIG. 4 shows the construction of a laser diode according to a second embodiment of the present invention.

Referring to FIG. 4, the laser diode is constructed on a Si substrate 31 of $n^+$-type and includes a lower cladding layer 32 of n-type formed on the Si substrate 31, wherein an active layer 33 of an undoped SiGeC mixed crystal is formed on the lower cladding layer 32 epitaxially with a thickness of preferably about 300 nm. The SiGeC mixed crystal layer 33 may be formed according to a process similar to the CVD process described previously with reference to the preceding embodiment by using $SiH_4$, $GeH_4$ and $SiH_3CH_3$ as respective source gases of Si, Ge and C.

On the active layer 33, there is formed an upper cladding layer 34 of p-type Si, and the lower cladding layer 32, the active layer 33 and the upper cladding layer 34 thus formed are patterned by a wet etching process while using a resist mask to form a mesa structure, such that the surface of the Si substrate 31 is exposed at both lateral sides of the mesa structure as a result of the patterning.

The mesa structure thus formed is covered with a thin layer 35 of undoped Si at both sidewalls thereof, and insulating regions 36A and 36B of SiO$_2$ are formed at both lateral sides of the mesa structure so as to cover the exposed surface of the Si substrate 31.

Further, a top electrode 37 of Ti is formed on the Si layer 34 in the mesa structure in ohmic contact therewith, and a bottom electrode 38 of Ti is formed on the bottom surface of the Si substrate 31 so as to form an ohmic contact.

The laser diode of FIG. 4 oscillates successfully at the 1.3 μm wavelength band due to the use of the SiGeC mixed crystal with the composition defined by the compositional parameters x and y of 0.32 and 0.04, respectively. As a result of the use of the mesa structure, the drive current is confined into the narrow active layer 33 and the efficiency of laser oscillation is improved substantially. Further, the active layer 33 having such a composition achieves a lattice matching with the Si substrate 31, and thus, the laser diode of FIG. 4 form an opto-electronic integrated circuit on the Si substrate 31 together with other electronic devices.

In the fabrication process of the laser diode of FIG. 4, the epitaxial layers 32 and 34 are formed as usual by using SiH$_4$ as the source gas, with a dopant gas of PH$_3$ added to the source gas when growing the epitaxial layer 32. When growing the epitaxial layer 34, on the other hand, a dopant gas of B$_2$H$_6$ is added.

In the present embodiment, too, it is possible to use a mixed crystal of SiGeC similar to the one used for the active layer 33 for the cladding layers 32 and 34 as long as the Ge content and/or C content therein is reduced as compared with the active layer 33 so as to increase the bandgap of the cladding layers 32 and 34.

[Third Embodiment]

Figure 5:
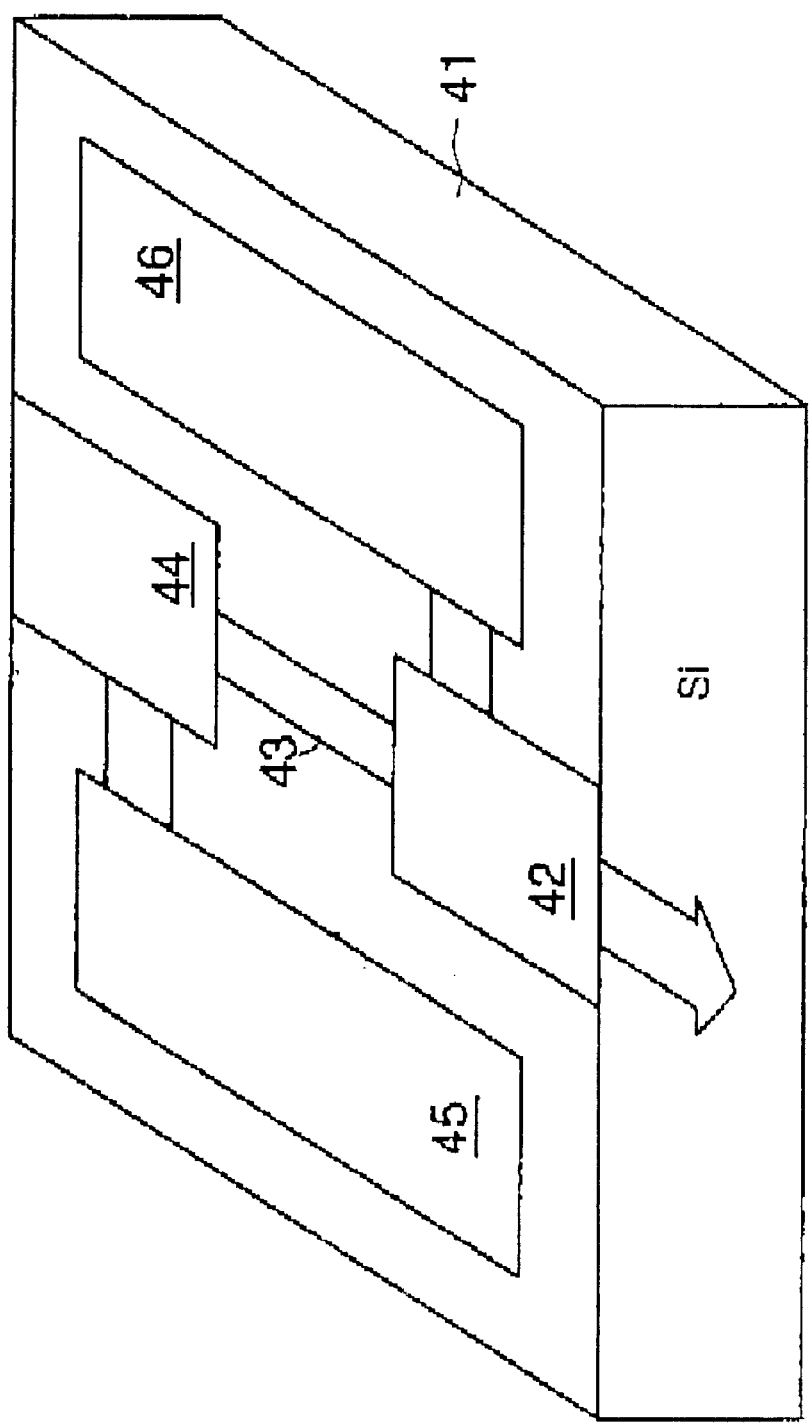
FIG. 5 is a diagram showing the construction of an opto-electronic circuit according to a third embodiment of the present invention.

FIG. 5 shows the construction of an opto-electronic integrated circuit according to a third embodiment of the present invention.

Referring to FIG. 5, the opto-electronic integrated circuit is constructed on a Si substrate 41 and includes a laser diode 42, an optical waveguide 43, an optical detector 44, a driver circuit 45 driving the optical detector 44 and another driver circuit 46 driving the laser diode 42, wherein the laser diode 42, the optical waveguide 43, the optical detector 44, the driver circuit 45 and the driver circuit 46 are formed monolithically on the Si substrate 41.

Figure 6:
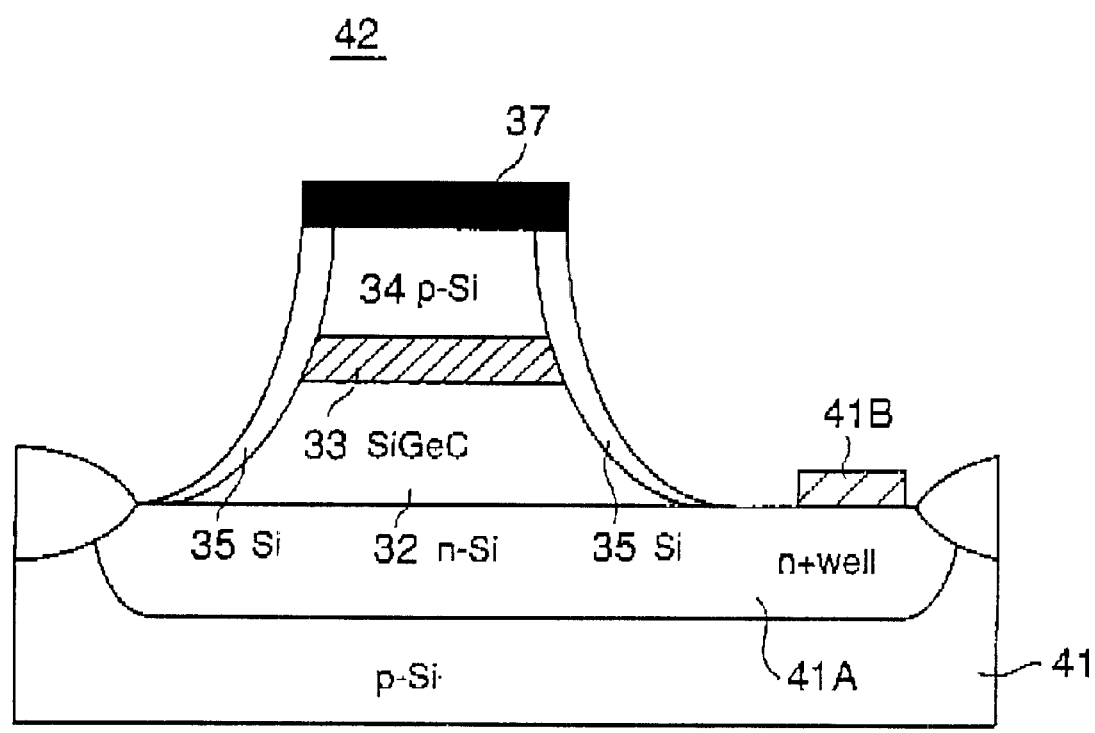
FIG. 6 is a diagram showing the construction of a laser diode used in the opto-electronic integrated circuit of FIG. 5.

FIG. 6 shows an example of the construction of the laser diode 42 used in the opto-electronic integrated circuit of FIG. 5, wherein those parts corresponding to the parts described previously are designated by the same reference numerals and the description thereof will be omitted.

Referring to FIG. 6, the Si substrate 41 on which the laser diode 43 is formed is doped to p-type, and a well 41A of n$^+$-type is formed in the Si substrate 41 in correspondence to the part where the laser diode 43 is formed in such a manner that the well 41A is surrounded by a field oxide film. Thereby, the lower cladding layer 32 of n-type Si is formed on the n$^+$-type well 41A, and the random SiGeC active layer 33 and the upper cladding layer 34 of p-type Si are formed consecutively on the n-type Si layer 32. Further, the layered structure thus formed is subjected to a mesa-etching process similarly to the laser diode of FIG. 4 and the top electrode 37 is formed on the p-type Si layer 34 in ohmic contact therewith. Further, a bottom electrode 41B is provided on the n$^+$-type well 41A in ohmic contact therewith. Similarly to the laser diode of FIG. 4, both sidewalls of the mesa structure are covered with the undoped Si layer 35.

Figure 7:
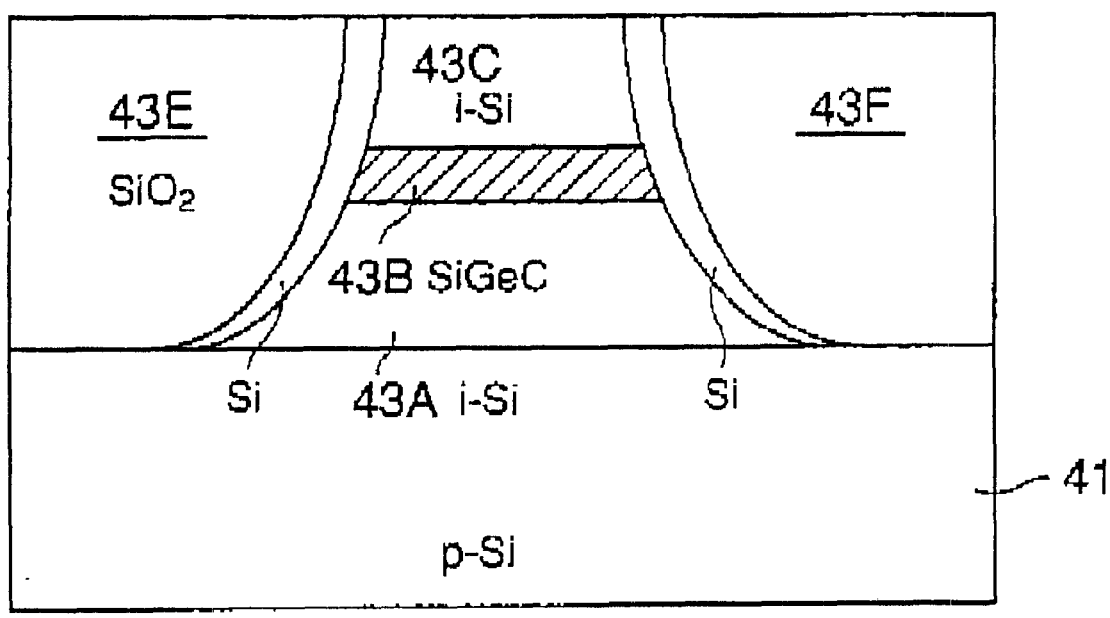
FIG. 7 is a diagram showing the construction of an optical waveguide used in the opto-electronic integrated circuit of FIG. 6.

FIG. 7 shows the construction of the optical waveguide 43 used in the opto-electronic integrated circuit of FIG. 5 in a cross-sectional view.

Referring to FIG. 7, the optical waveguide 43 is constructed on the foregoing p-type Si substrate 41 and has a construction similar to that of the laser diode 42.

More specifically, the optical waveguide 43 includes a lower cladding layer 43A of undoped Si formed epitaxially on the Si substrate 41 in correspondence to the lower cladding layer 32, and an optical waveguide layer 43B of a mixed crystal of undoped SiGeC is formed epitaxially on the cladding layer 43A thus formed. The optical waveguide layer 43B has a composition represented as $Si_{1-x-y}Ge_xC_y$, wherein the compositional parameters x and y are set smaller than the corresponding compositional parameters x and y of the SiGeC active layer 33 of the laser diode 42.

On the optical waveguide layer 43B, there is further provided an upper cladding layer 43C of undoped Si similarly to the upper cladding layer 34 of the laser diode 42, and the layered body thus formed of the lower cladding layer 43A, the optical waveguide layer 43B and the upper cladding layer 43C is subjected to a mesa-etching process to form a mesa structure such that the surface of the Si substrate 41 is exposed at both lateral sides thereof after the mesa-etching process.

The mesa structure thus formed is covered with a thin layer of undoped Si at both sidewalls thereof, and the exposed surface of the Si substrate 41 is covered with SiO$_2$ patterns 43E and 43F at both lateral sides of the mesa structure.

In the optical waveguide of FIG. 7, the compositional parameter x representing the concentration level of Ge and the compositional parameter y representing the concentration level of Si in the optical waveguide layer 43B are set smaller than the corresponding compositional parameters x and y in the SiGeC active layer 33 as noted previously. As a result, the bandgap is increased in the optical waveguide layer 43B as compared with the case of the active layer 33, and the absorption of the optical beam produced by the laser diode 42 in the optical waveguide 43 is effectively eliminated. As the SiGeC mixed crystal thus containing small amount of Ge and C is characterized by a higher refractive index as compared with the Si cladding layer 43A or 43C and the optical beam is effectively confined in the optical waveguide layer 43B. It is also possible to construct the optical waveguide layer 43B by a pure Si layer free from Ge or C.

Further, the present invention is not limited to the embodiments described heretofore, but various variations and modifications may be made without departing from the scope of the invention.

What is claimed is:

1. An optical semiconductor device, comprising:
    a Si substrate having a first conductivity type;
    an active layer of a SiGeC mixed crystal formed over said Si substrate with an epitaxial relationship with respect to said Si substrate, said SiGeC mixed crystal containing Si atoms, Ge atoms, and C atoms in a random atomic arrangement, said SiGeC mixed crystal having a direct-transition band structure;
    an upper cladding layer formed on said active layer with a second, opposite conductivity type;
    a first electrode provided on said Si substrate in electric connection with said Si substrate; and
    a second electrode provided in electric connection with said upper cladding layer,
    said active layer having a composition represented in terms of compositional parameters x and y as $Si_{1-x-y}Ge_xC_y$,
    said compositional parameter x being 0.24 and said compositional parameter y being 0.03.

2. An optical semiconductor device as claimed in claim 1, further comprising a lower cladding layer of said first conductivity type between said Si substrate and said active layer.

3. An optical semiconductor device as claimed in claim 2, wherein said upper and lower cladding layers are formed of a SiGeC mixed crystal containing Si atoms, Ge atoms, and C atoms in a random atomic arrangement, said upper and lower cladding layers containing said Ge atoms and said C atoms with respective smaller concentration levels as compared with Ge atoms and C atoms contained in said active layer.

4. An optical semiconductor device as claimed in claim 3, wherein said upper and lower cladding layers are substantially free from either or both of said Ge and C atoms.

5. An opto-electronic integrated circuit, comprising:
a Si substrate having a first region having a first conductivity type and a second region;
a laser diode formed on said first region of said Si substrate,
said laser diode comprising:
a lower cladding layer formed epitaxially on said first region of said Si substrate with said first conductivity type;
an active layer of a SiGeC mixed crystal formed on said lower cladding layer epitaxially, said SiGeC mixed crystal containing Si atoms, Ge atoms, and C atoms in a random atomic arrangement;
an upper cladding layer formed on said active layer with a second, opposite conductivity type;
a first ohmic electrode provided in electric connection with said Si substrate;
and a second ohmic electrode provided in electric connection with said upper cladding layer, said active layer having a composition represented in terms of compositional parameters x and y as $Si_{1-x-y}Ge_xC_y$, said compositional parameter x being about 0.24 and said compositional parameter y being about 0.03;
said SiGeC mixed crystal having a direct-transition band structure,
an optical waveguide provided on said second region of said Si substrate, and
an electronic device formed on a third region of said Si substrate.

6. An opto-electronic integrated circuit as claimed in claim 5, wherein said optical waveguide comprising:
a lower cladding layer formed epitaxially on said second region of said Si substrate;
an optical waveguide layer of a SiGeC mixed crystal formed on said lower cladding layer epitaxially, said SiGeC mixed crystal containing Si atoms, Ge atoms, and C atoms in a random atomic arrangement;
and an upper cladding layer formed on said optical waveguide layer, said optical waveguide layer having a composition set such that said optical waveguide layer has a larger bandgap as compared with a bandgap of said SiGeC mixed crystal forming said active layer of said laser diode.

7. An opt-electronic integrated circuit as claimed in claim 6, wherein said optical waveguide layer contains said Ge and C atoms with respective concentration levels smaller than in said SiGeC mixed crystal forming said active layer of said laser diode.

8. An opto-electronic integrated circuit as claimed in claim 6 wherein said optical waveguide layer comprises:
a lower cladding layer formed epitaxially on said second region of said Si substrate;
an optical waveguide layer formed on said lower cladding layer formed on said optical waveguide layer, said optical waveguide layer being formed of a substantially pure Si layer.

9. An optical semiconductor device comprising:
a Si substrate having a first conductivity type;
an active layer of a SiGeC mixed crystal formed over said Si substrate with an epitaxial relationship with respect to said Si substrate, said SiGeC mixed crystal containing Si atoms, Ge atoms, and C atoms in a random atomic arrangement, said SiGeC mixed crystal having a direct-transition band structure for 0.95 eV or less bandgap energy;
said active layer having a composition represented in terms of compositional parameters x and y as $Si_{1-x-y}Ge_xC_y$, said compositional parameter x being about 0.24 and said compositional parameter y being about 0.03.

10. An opto-electronic integrated circuit, comprising:
a Si substrate having a first region having a first conductivity type and a second region;
a laser diode formed on said first region of said Si substrate,
said laser diode comprising:
a lower cladding layer formed epitaxially on said first region of said Si substrate with said first conductivity type;
and an active layer of a SiGeC mixed crystal formed on said lower cladding layer epitaxially, said SiGeC mixed crystal containing Si atoms, Ge atoms, and C atoms in a random atomic arrangement;
an upper cladding layer formed on said active layer with a second, opposite conductivity type; a first ohmic electrode provided in electric connection with said Si substrate;
and a second ohmic electrode provided in electric connection with said upper cladding layer, said active layer having a composition represented in terms of compositional parameters x and y as $Si_{1-x-y}Ge_xC_y$, said compositional parameter x being about 0.24 and said compositional parameter y being about 0.03;
said SiGeC mixed crystal having a direct-transition band structure for 0.95 eV or less bandgap energy,
an optical waveguide provided on said second region of said Si substrate, and
an electronic device formed on a third region of said Si substrate.

11. An optical semiconductor device, comprising:
a Si substrate having a first conductivity type;
an active layer of a SiGeC mixed crystal formed over said Si substrate with an epitaxial relationship with respect to said Si substrate, said SiGeC mixed crystal containing Si atoms, Ge atoms, and C atoms in a random atomic arrangement, said SiGeC mixed crystal having a direct-transition band structure;
an upper cladding layer formed on said active layer with a second, opposite conductivity type;
a first electrode provided on said Si substrate in electric connection with said Si substrate; and
a second electrode provided in electric connection with said upper cladding layer,
said active layer having a composition represented in terms of compositional parameters x and y as $Si_{1-x-y}Ge_xC_y$,
said compositional parameter x being 0.32 and said compositional parameter y being 0.04.

12. An opto-electronic integrated circuit, comprising:

a Si substrate having a first region having a first conductivity type and a second region;

a laser diode formed on said first region of said Si substrate, said laser diode comprising:

a lower cladding layer formed epitaxially on said first region of said Si substrate with said first conductivity type;

an active layer of a SiGeC mixed crystal formed on said lower cladding layer epitaxially, said SiGeC mixed crystal containing Si atoms, Ge atoms, and C atoms in a random atomic arrangement;

an upper cladding layer formed on said active layer with a second, opposite conductivity type;

a first ohmic electrode provided in electric connection with said Si substrate;

and a second ohmic electrode provided in electric connection with said upper cladding layer, said active layer having a composition represented in terms of compositional parameters x and y as $Si_{1-x-y}Ge_xC_y$, said compositional parameter x being about 0.32 and said compositional parameter y being about 0.04;

said SiGeC mixed crystal having a direct-transition band structure, an optical waveguide provided on said second region of said Si substrate, and an electronic device formed on a third region of said Si substrate.

13. An optical semiconductor device comprising:

a Si substrate having a first conductivity type;

an active layer of a SiGeC mixed crystal formed over said Si substrate with an epitaxial relationship with respect to said Si substrate, said SiGeC mixed crystal containing Si atoms, Ge atoms, and C atoms in a random atomic arrangement, said SiGeC mixed crystal having a direct-transition band structure for 0.95 eV or less bandgap energy, said active layer having a composition represented in terms of compositional parameters x and y as $Si_{1-x-y}Ge_xC_y$, said compositional parameter x being about 0.32 and said compositional parameter y being about 0.04.

14. An opto-electronic integrated circuit, comprising:

a Si substrate having a first region having a first conductivity type and a second region;

a laser diode formed on said first region of said Si substrate, said laser diode comprising:

a lower cladding layer formed epitaxially on said first region of said Si substrate with said first conductivity type;

and an active layer of a SiGeC mixed crystal formed on said lower cladding layer epitaxially, said SiGeC mixed crystal containing Si atoms, Ge atoms, and C atoms in a random atomic arrangement;

an upper cladding layer formed on said active layer with a second, opposite conductivity type;

a first ohmic electrode provided in electric connection with said Si substrate;

and a second ohmic electrode provided in electric connection with said upper cladding layer, said active layer having a composition represented in terms of compositional parameters x and y as $Si_{1-x-y}Ge_xC_y$, said compositional parameter x being about 0.32 and said compositional parameter y being about 0.04;

said SiGeC mixed crystal having a direct-transition band structure for 0.95 eV or less bandgap energy, an optical waveguide provided on said second region of said Si substrate, and an electronic device formed on a third region of said Si substrate.

* * * * *